(12) United States Patent
Stoving et al.

(10) Patent No.: US 11,728,117 B2
(45) Date of Patent: Aug. 15, 2023

(54) SWITCHING APPARATUS WITH ELECTRICALLY ISOLATED USER INTERFACE

(71) Applicant: Eaton Intelligent Power Limited, Dublin (IE)

(72) Inventors: Paul Newcomb Stoving, Oak Creek, WI (US); Christopher Randall Hastreiter, South Milwaukee, WI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/402,073

(22) Filed: Aug. 13, 2021

(65) Prior Publication Data
US 2022/0076910 A1 Mar. 10, 2022

Related U.S. Application Data

(60) Provisional application No. 63/074,547, filed on Sep. 4, 2020.

(51) Int. Cl.
| | | |
|---|---|---|
| *H01H 71/02* | (2006.01) | |
| *H01H 71/10* | (2006.01) | |
| *G01R 15/18* | (2006.01) | |

(52) U.S. Cl.
CPC .......... *H01H 71/10* (2013.01); *G01R 15/181* (2013.01); *H01H 71/02* (2013.01)

(58) Field of Classification Search
CPC .......... H01H 71/02; H01H 71/10; H01H 9/12; H01H 9/0271; H01H 9/167; H01H 33/666; H01H 33/027; H01H 2033/426; H01H 33/662; H01H 33/6662; H01H 2033/6667; G01R 15/181; G01R 31/3275

USPC ........ 200/293, 10; 335/6; 340/638; 218/118, 218/120, 134, 138, 139, 140
See application file for complete search history.

(56) References Cited

U.S. PATENT DOCUMENTS

| | | | |
|---|---|---|---|
| 2,414,956 A | 1/1947 | Kyle, Jr. et al. | |
| 2,477,067 A | 7/1949 | Kyle, Jr. et al. | |
| 3,597,556 A * | 8/1971 | Sharp ..................... | H01H 3/46 218/4 |
| 3,956,721 A | 5/1976 | Link | |

(Continued)

FOREIGN PATENT DOCUMENTS

| | | | | |
|---|---|---|---|---|
| CN | 209929219 | * | 1/2020 | ............ H01H 33/66 |
| WO | 2000/041199 | | 7/2000 | |
| WO | 2019/133611 A1 | | 7/2019 | |

OTHER PUBLICATIONS

Translation of CN209929219 (Original document published Jan. 10, 2020) (Year: 2020).*

(Continued)

*Primary Examiner* — William A Bolton
(74) *Attorney, Agent, or Firm* — DiBerardino McGovern IP Group, LLC

(57) ABSTRACT

An apparatus includes: a high-voltage module including: a current interrupter; an actuation system coupled to the current interrupter; a sensor system; and a terminal configured to electrically connect to an external electrical device. The apparatus also includes: a user interface; and an electrically insulating assembly between the user interface and the high-voltage module. In operational use, the user interface is grounded and the high-voltage module is at a system voltage.

22 Claims, 6 Drawing Sheets

(56) References Cited

U.S. PATENT DOCUMENTS

| | | | |
|---|---|---|---|
| 4,150,270 A * | 4/1979 | Zunick | H01H 33/66 |
| | | | 218/138 |
| 4,568,804 A | 2/1986 | Luehring | |
| 5,912,604 A * | 6/1999 | Harvey | H01H 33/6662 |
| | | | 218/138 |
| 6,198,062 B1 | 3/2001 | Mather et al. | |
| 6,628,494 B2 | 9/2003 | Opfer et al. | |
| 6,753,493 B2 | 6/2004 | Rhein et al. | |
| 6,760,206 B2 | 7/2004 | Daharsh et al. | |
| 6,888,086 B2 | 5/2005 | Daharsh et al. | |
| 7,133,271 B2 | 11/2006 | Jonas et al. | |
| 7,488,916 B2 | 2/2009 | Muench et al. | |
| 7,495,574 B2 * | 2/2009 | Rocamora | G08C 17/02 |
| | | | 361/115 |
| 8,334,738 B2 | 12/2012 | Smith et al. | |
| 8,450,630 B2 | 5/2013 | Stoving | |
| 9,177,742 B2 | 11/2015 | Ache et al. | |
| 9,640,350 B2 | 5/2017 | Stoving et al. | |
| 9,691,574 B2 * | 6/2017 | Gerovac | H01H 33/6606 |
| 9,741,482 B2 | 8/2017 | Weisburgh et al. | |
| 9,953,772 B2 | 4/2018 | Korves et al. | |
| 10,091,855 B2 | 10/2018 | Van Winkle | |
| 10,147,572 B2 * | 12/2018 | Huo | H01H 33/6606 |
| 2006/0084419 A1 | 4/2006 | Rocamora et al. | |
| 2020/0118776 A1 * | 4/2020 | Kowalyshen | H01H 33/666 |

OTHER PUBLICATIONS

Serge Ledoux, European International Searching Authority, International Search Report and Written Opinion, counterpart PCT Application No. PCT/EP2021/025315 dated Dec. 7, 2021, 14 pages total.

* cited by examiner

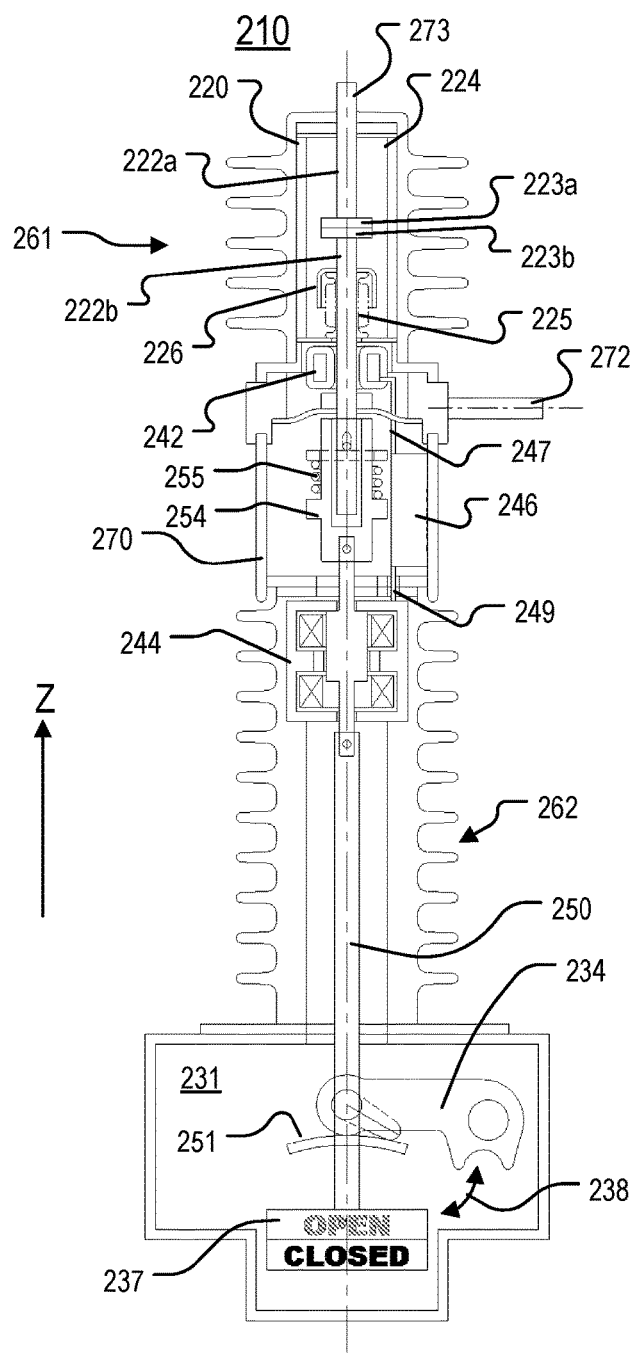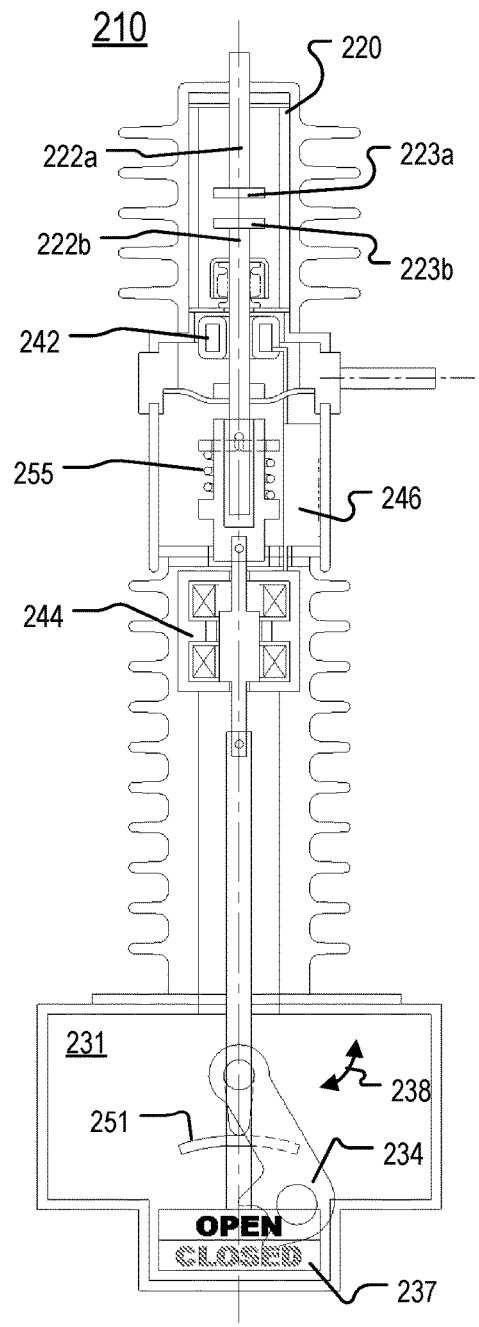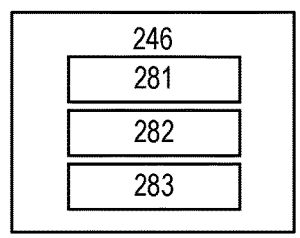
FIG. 2B
FIG. 2C
FIG. 2D

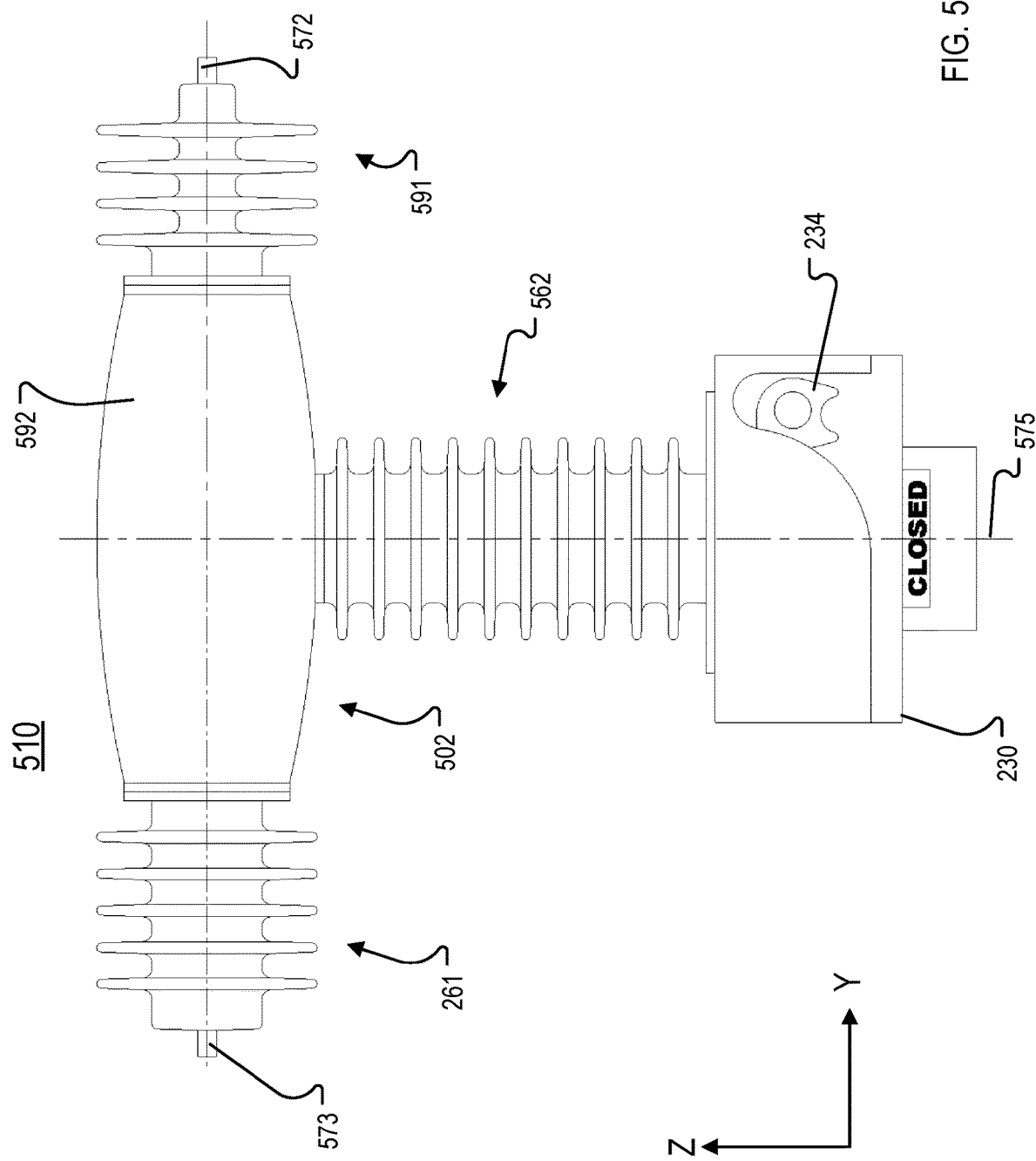

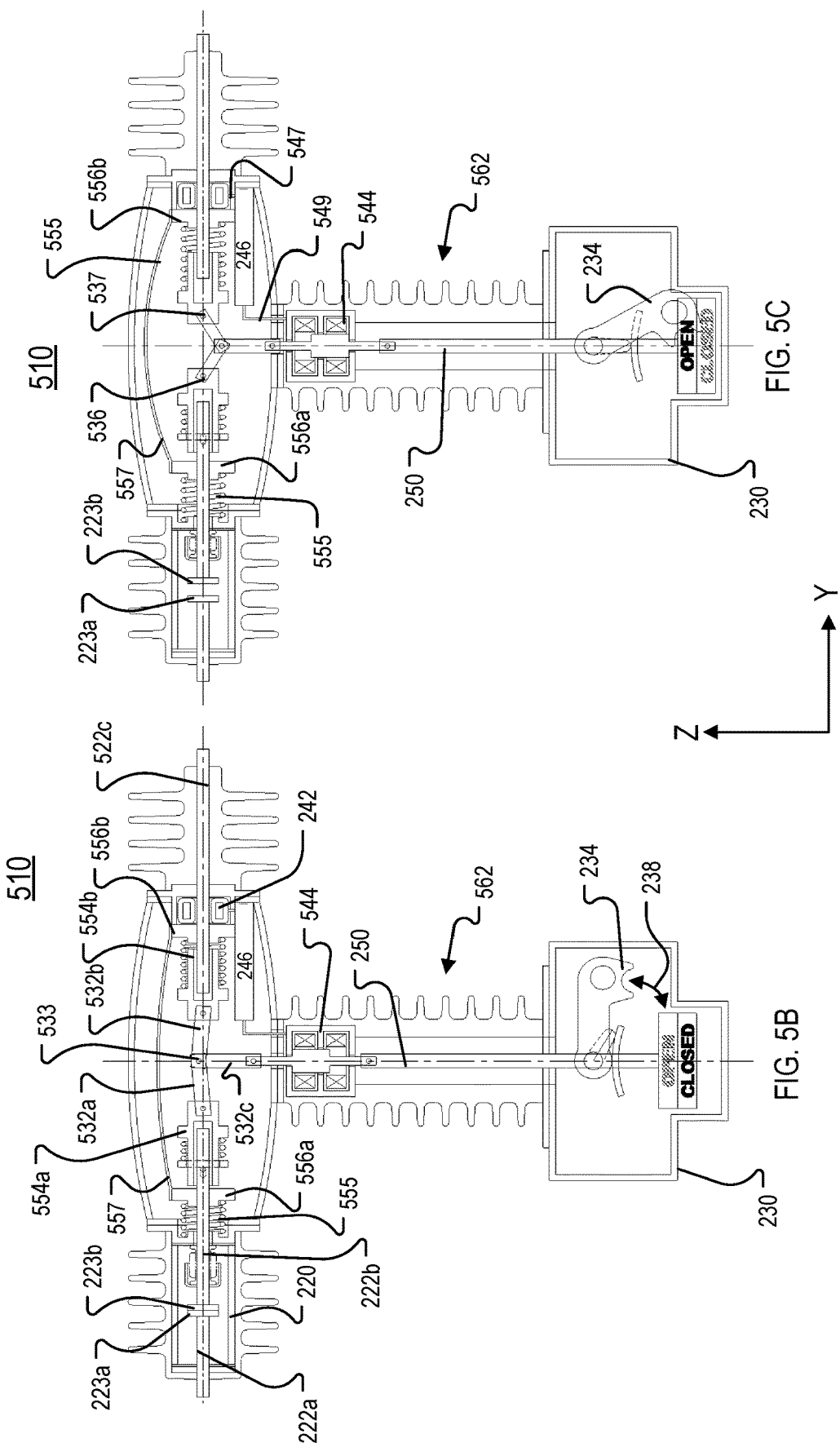

SWITCHING APPARATUS WITH ELECTRICALLY ISOLATED USER INTERFACE

CROSS-REFERENCE TO RELATED APPLICATION

This application claims the benefit of U.S. Provisional Application No. 63/074,547, filed on Sep. 4, 2020 and titled SWITCHING APPARATUS WITH ELECTRICALLY ISOLATED USER INTERFACE, which is incorporated herein by reference in its entirety.

TECHNICAL FIELD

This disclosure relates to a switching apparatus with an electrically isolated user interface.

BACKGROUND

A current interrupter is used to interrupt current to a load. In operational use, the current interrupter is at a relatively high voltage, for example, 12 kilovolts (kV) or higher. The current interrupter is enclosed in a housing. Various components that are used in the operation of the current interrupter also may be enclosed in the housing.

SUMMARY

In one aspect, an apparatus includes: a high-voltage module including: a current interrupter; an actuation system coupled to the current interrupter; a sensor system; and a terminal configured to electrically connect to an external electrical device. The apparatus also includes: a user interface, and an electrically insulating assembly between the user interface and the high-voltage module. In operational use, the user interface is grounded and the high-voltage module is at a system voltage.

Implementations may include one or more of the following features.

In some implementations, the user interface does not surround the high-voltage module.

The electrically insulating assembly, the user interface, and at least a portion of the high-voltage module may be arranged along a longitudinal axis of the apparatus; and the electrically insulating assembly may extend along the longitudinal axis.

The user interface may include: a tank, and a manual operating mechanism on an exterior of the tank. The user interface also may include: an indicator on the exterior of the tank, and the indicator may be configured to produce a perceivable indication related to a status of the current interrupter.

The user interface may include a visible indicator configured to produce an indication related to a status of the current interrupter, and the indication may be visually perceivable from an exterior of the apparatus.

The circuit interrupter may be a vacuum interrupter. The vacuum interrupter may include: a stationary electrical conductor electrically connected to a stationary conductor, and a moving electrical conductor electrically connected to a moving conductor. The electrically insulating assembly may include an electrically insulating operating rod mechanically coupled to the moving electrical conductor. The electrically insulating operating rod may be mechanically coupled to the moving electrical conductor by a spring.

The sensor system may include a current transformer. The sensor system may include a Rogowski coil.

The high-voltage module also may include an electronic control. The sensor system may include an energy harvesting device. The electronic control may be powered by the sensor system. The sensor system may be configured to measure an electrical quantity of the current interrupter, and to provide an indication of the measured electrical quantity to the electronic control. The electronic control may be configured to determine whether a fault condition exists based on the indication.

The apparatus also may include an insulating housing, and the high-voltage module may be inside the insulating housing. The insulating housing may be configured to mechanically connect to and disconnect from a second insulating housing such that the switching apparatus is a modular apparatus, and the electrically insulating assembly may be inside the second insulating housing.

The system voltage is 15 kilovolts (kV) or higher.

The electrically insulating assembly may include a plurality of electrically insulating rods.

The apparatus also may include an indication system configured to provide an indication of a status of the current interrupter.

In another aspect, a modular switching apparatus includes: a current interrupter; an interrupter housing that surrounds the current interrupter; an electrically insulating operating rod configured to control a state of the current interrupter; an operating housing that surrounds the electrically insulating operating rod; and a user interface. The interrupter housing and the operating housing are removably connected to each other and the user interface is configured for connection to the interrupter housing or the operating housing.

Implementations of any of the techniques described herein may include a system, a switching apparatus, an electrically insulating assembly for retrofitting an existing switching apparatus, and/or a method. The details of one or more implementations are set forth in the accompanying drawings and the description below. Other features will be apparent from the description and drawings, and from the claims.

DRAWING DESCRIPTION

FIGS. 2A-2C show various views of another example of a switching apparatus.

FIG. 2D is a block diagram of an example of an electronic control for a switching apparatus.

FIGS. 5A-5C show various views of another example of a switching apparatus.

DETAILED DESCRIPTION

Figure 1:
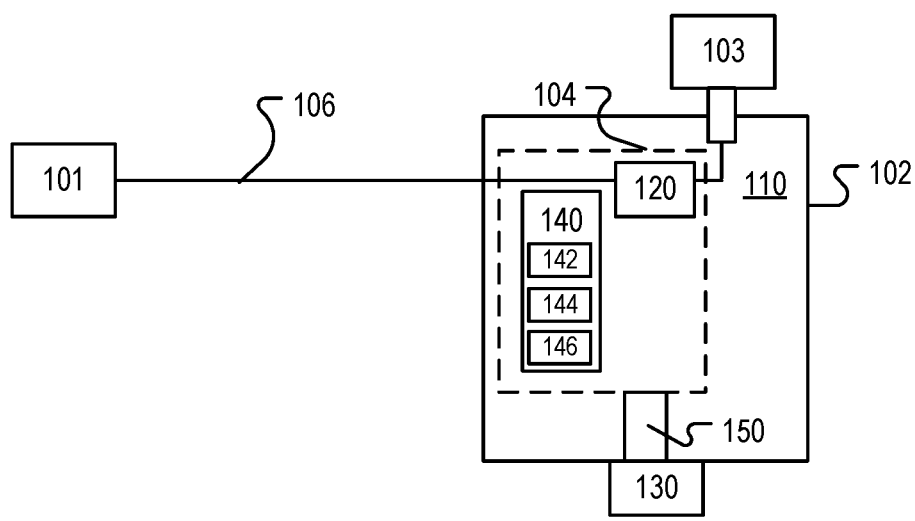
FIG. 1 is a block diagram of an example of a switching apparatus.

FIG. 1 is a block diagram of a switching apparatus 110 that controls the flow of electricity in a distribution path 106. The distribution path 106 may include, for example, one or more distribution lines, electrical cables, and/or any other mechanism for transmitting electricity. The distribution path 106 is part of a power distribution system 100 that distributes electricity to industrial, commercial, and/or residential customers.

The power distribution system 100 is an alternating current (AC) system with a system operating voltage of, for example, at least 1 kilovolt (kV), 25 kV, 27, kV, 29 kV, up to 34.5 kV, up to 38 kV, up to 69 kV, or 69 kV or higher and a fundamental frequency of, for example, 50 or 60 Hertz (Hz). The power distribution system 100 includes one or more AC electricity sources 101 and one or more loads 103. The source 101 is any source of electricity such as, for example, a power plant that generates electricity from fossil fuel or from thermal energy, or an electrical substation. The source 101 may include one or more distributed energy resources, such as, for example, a solar energy system that includes an array of photovoltaic (PV) devices that convert sunlight into electricity or a wind-based energy system. More than one power source may supply electricity to the distribution system 100, and more than one type of power source may supply electricity to distribution system 100. The load 103 is any type of device or system that utilizes AC electricity and may include electrical equipment that receives and transfers or distributes electricity to other equipment in the distribution system 100. The load 103 may include, for example, transformers, switchgear, energy storage systems, computer and communication equipment, lighting, heating and air conditioning, motors and electrical machinery in a manufacturing facility, and/or electrical appliances and systems in a residential building.

The switching apparatus 110 includes a current interrupter 120 that is enclosed in a housing 102. The current interrupter 120 is any type of device capable of interrupting the supply of electricity to the load 103. The current interrupter 120 may be rated for voltages between, for example, 15 kV and 38 kV, between 15 kV and 30 kV, for voltages greater than 15 kV, for 15 kV, 25 kV, 27 kV, 29 kV, or for 29.2 kV. The current interrupter 120 may be rated for continuous current of, for example, between 5 amperes (A) and 600 A, or between 100 and 200 A. The current interrupter 120 may be capable of interrupting fault currents of, for example, 200 A to 10 kA, 1 kA to 4 kA, 1 kA to 7 kA, or 6.3 kA. The current interrupter 120 may be, for example, a switch that is capable of opening and closing repeatedly, such as a vacuum interrupter, oil interrupter, air interrupter, a sulfur hexafluoride (SF$_6$) interrupter, or a solid state device. Other types of devices that are capable of interrupting and conducting current but are not necessarily capable of opening and closing repeatedly, such as a fuse, may be used as the current interrupter 120. In implementations in which the current interrupter 120 is a vacuum interrupter or other switch that is capable of opening and closing repeatedly, the switching apparatus 110 may be a recloser and may be a single-phase, solid dielectric recloser.

When the current interrupter 120 is open, electrical current does not flow to the load 103. When the current interrupter 120 is closed, the load 103 is electrically connected to the distribution path 106, and electrical current flows to the load 103.

The switching apparatus 110 includes the current interrupter 120, various components 140 that are associated with the operation of the current interrupter 120, and a user interface 130. The current interrupter 120 and the various components 140 are part of a high-voltage module 104 and are not substantially insulated from each other. The high-voltage module 104 is shown as a dashed line box in FIG. 1. The dashed-line box represents a grouping of elements, and the high-voltage module 104 is not necessarily a physical component that encloses the current interrupter 120 and the various components 140.

The user interface 130 is electrically isolated from the current interrupter 120 and the components 140 by an electrically insulating assembly 150. The electrically insulating assembly 150 may include an insulated operating rod, such as an insulating operating rod 250, which is shown in FIGS. 2B, 2C, 5B, and 5C. Other implementations are possible. For example, the electrically insulating assembly 150 may include more than one insulating operating rod. In some implementations, the electrically insulating assembly 150 includes three insulating operating rods. In another example, the electrically insulating assembly 150 includes insulation at the high-voltage module 104. Such insulation may include any type of electrically insulating material and may be in the form of, for example, casting, molding, potting, stuffing, wrapping, or a pre-formed insulation that is inserted into the housing 102.

Under typical operating conditions, the elements of the high-voltage module 104 (the current interrupter 120 and the components 140) are at the system voltage of the distribution path 106, and the user interface 130 is grounded or is at a low voltage that is nearly grounded. For example, if the distribution path 106 is part of a distribution system that has a system voltage of 27 kV, the current interrupter 120 and the components 140 are at or near a voltage of 27 kV and the user interface 130 is grounded or at a very low voltage that is safe for a human to touch without protective equipment.

The components 140 include any type of device or system associated with the operation or monitoring of the current interrupter 120. The components 140 may include, for example, an actuation system 144 that controls a state of the current interrupter 120, a sensor system 142, and an electronic control 146 that controls or interacts with the actuation system 144 and/or the sensor system 142.

The sensor system 142 includes any type of sensor capable of monitoring electrical properties (for example, voltage and/or current) in the current interrupter 120 and/or the switching apparatus 110, any or any type of sensor capable of harvesting electrical power to power the electronic control 142, and/or any type of sensor capable of sensing information about the switching apparatus 110 and/or the environment in which the switching apparatus 110 operates. For example, the sensor system 142 may include one or more current sensors, one or more voltage sensors, and/or one or more environmental sensors. The current sensor may be a current transformer (CT), a Rogowski coil, a Hall effect sensor, or an optical sensor, just to name a few. Sensors such as a CT or a Rogowski coil can harvest electrical energy to power the electronic control 146. In implementations that include such a sensor, the sensor system 142 may be configured to support monitoring and fault detection as well as being a local source of power.

The components 140 and the current interrupter 120 are inside the housing 102 and are not generally intended for direct interaction with a human operator of the switching apparatus 110 while the switching apparatus 110 is electrically connected to the distribution path 106.

The user interface 130 allows manual control and/or monitoring of the current interrupter 120 and/or one or more of the components 140. The user interface 130 is accessible from an exterior of the housing 102, and the user interface 130 is intended to be used by a human operator. The user interface 130 may include, for example, a handle that allows manual operation of the current interrupter 120 and/or a perceivable indicator that provides the status of the current interrupter 120. The user interface 130 also may include a mounting assembly that is used to attach the switching apparatus 110 to a utility pole or other structure.

Some traditional switching apparatuses are configured such that the user interface and at least some components associated with the operation or monitoring of the current interrupter are grounded or are held at a relatively low voltage during use of the switching apparatus. For example, such a traditional switching apparatus may hold the electronic control, the actuator, and the sensor at ground with the user interface. Although such a configuration provides a grounded or low voltage user interface that is safe and convenient for a human operator to use, robust electrical insulation between the operating monitoring components that are at a relatively low voltage or are grounded and the interrupting mechanism (which is at the system voltage) is needed. The robust electrical insulation increases cost and manufacturing complexity. Moreover, in use, such a configuration has a large voltage difference between the current interrupter (which is at the system voltage) and the elements that are maintained at the relatively low voltage or ground. The voltage difference causes mechanical and electrical stress in the interior of the switching apparatus and also requires a robust manufacturing process. Additionally, because the electronic control is grounded in this type of traditional configuration, robust electronics are used in the electronic control to manage large current or voltage surges to ground that occur under fault conditions. The robust electronics also increase cost and complexity.

In still other traditional switching apparatuses, the user interface, electronic control, current interrupter, sensors, and the electronic control are electrically connected to each other and are all at the system voltage during use. Although such an approach reduces challenges that may arise from the presence of voltage differences within the switching apparatus, because the user interface is at the system voltage, these types of traditional switching apparatus have stringent mounting and operating requirements.

On the other hand, in the switching apparatus 110, the insulating assembly 150 insulates the current interrupter 120 and the components 140 from the user interface 130. This allows the user interface 130 to be at a low voltage or grounded during use of the switching apparatus 110, while the components 140 and the current interrupter 120 are at the system voltage. Therefore, there is no voltage differential between the current interrupter 120 and the various components 140 during use. Consequently, the switching apparatus 110 provides a safe and convenient user interface 130 for the operator but has fewer components and is less complex to manufacture than a traditional switching apparatus that has a voltage difference between the current interrupter and one or more of the components that support the operation of the current interrupter.

Figure 2A:
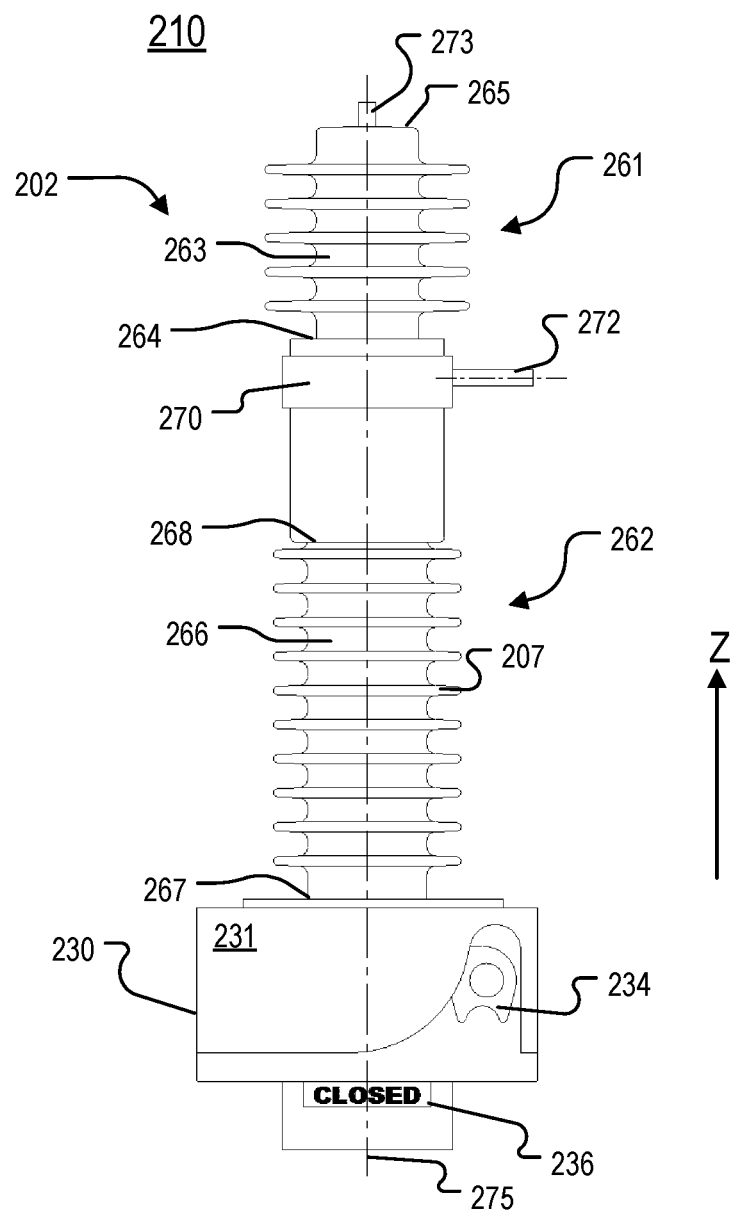

FIGS. 2A-2C relate to a switching apparatus 210. The switching apparatus 210 is an example of an implementation of the switching apparatus 110 (FIG. 1). FIG. 2A is a side exterior view of the switching apparatus 210. FIGS. 2B and 2C are cross-sectional side views of the switching apparatus 210. FIG. 2B shows the switching apparatus 210 in a closed state. FIG. 2C shows the switching apparatus 210 in an open state.

The switching apparatus 210 includes a vacuum interrupter 220 (FIGS. 2B and 2C) and various components that are associated with the vacuum interrupter 220, including a current transformer 242, an actuator 244, and an electronic control 246. The vacuum interrupter 220, the current transformer 242, the actuator 244, and the electronic control 246 are electrically connected without any substantial insulation between them. These elements are electrically isolated from a user interface 230 by the insulating operating rod 250. When the switching apparatus 210 is used in an electrical distribution system such as the system 100, the vacuum interrupter 220, the current transformer 242, the actuator 244, and the electronic control 246 are at the system voltage and the user interface 230 is not at the system voltage. For example, the user interface 230 may be grounded or held at a low voltage.

In greater detail and referring to FIG. 2A, the switching apparatus 210 includes a housing 202 and the user interface 230. The switching apparatus 210 generally extends along a longitudinal axis 275, which is along the Z axis in the example of FIG. 2A. The housing 202 includes an interrupter housing 261 and an operating housing 262. The interrupter housing 261 is a three-dimensional body 263 that extends in the Z direction from an end 264 to an end 265. The operating housing 262 includes a three-dimensional body 266 that extends in the Z direction from an end 267 to an end 268. The housings 261 and 262 include sheds (one of which is labeled as 207) that extend radially outward from the respective bodies 263 and 266. The sheds 207 increase the withstand voltage of the switching apparatus 210. The housing 202 also includes a terminal ring 270 that is between the interrupter housing 261 and the operating housing 262. The housing 202 has a generally circular cross section in the X-Y plane.

The switching apparatus 210 also includes a terminal 272 and a terminal 273, both of which are made of an electrically conductive material, such as, for example, copper, silver, brass, bronze, aluminum, and/or another metal. The terminals 272 and/or 273 may be plated with silver or tin to help prevent corrosion. The terminal 272 extends radially outward from the terminal ring 270. The terminal 272 allows the switching apparatus 210 to electrically connect to an external device (such as the distribution path 106 of FIG. 1). The terminal 273 extends from the end 265 in the Z direction. The terminal 273 also allows the switching apparatus 210 to electrically connect to an external device. For example, the terminal 273 may be electrically connected to the load 103 (FIG. 1).

The terminals 272 and 273 are used to electrically connect the apparatus 210 to external devices. Connecting the apparatus 210 to external devices results in the apparatus 210 being installed in an electrical system (such as the power distribution system 100 of FIG. 1). When the switching apparatus 210 is installed in an electrical system, the terminals 272 and 273 are at the system voltage. Although the terminals 272 and 273 may be considered to act as electrical connection interfaces during installation of the switching apparatus 210 and when the apparatus 210 is installed, the terminals 272 and 273 are not part of the user interface 230.

The user interface 230 is connected to the housing 202 at the end 267. The user interface 230 includes a tank 231. The tank 231 is a three-dimensional object made of a solid, rugged material such as, for example, a polymer, a hardened plastic, or a metal such as aluminum or steel. If the tank 231 is a metal, it may be painted, plated, or otherwise treated to reduce corrosion. In implementations in which the tank 231 is a plastic or other dielectric, the plastic or other dielectric may be conductive or insulating. For example, the plastic or other dielectric may be a doped with a metal or other electrically conductive material. In another example, the plastic or other dielectric material used for the tank 231 is painted and/or coated with a metal or other dielectric material. The user interface 230 and the housing 202 are connected in a manner that prevents water or debris from entering the housing 202 or the user interface 230.

The user interface 230 includes a manual operating mechanism 234 and a perceivable indicator 236. The manual operating mechanism 234 and the perceivable indicator 236 are accessible from an exterior of the tank 231. The manual operating mechanism 234 is any type of mechanism that allows a human operator of the switching apparatus 210 to change the state of the vacuum interrupter 220. For example, the manual operating mechanism 234 may be a handle or a push-button.

The perceivable indicator 236 is any type of indicator that is capable of producing a perceivable indication on an exterior of the user interface 230. In the example of FIGS. 2A-2C, the perceivable indicator 236 is a window that shows a portion of a sign 237 (FIGS. 2B and 2C). The sign 237 includes the text "OPEN" and the text "CLOSED" directly below (in the −Z direction). Other implementations are possible. For example, the perceivable indicator 236 may include two lights, each having a different color. When the light of the first color is illuminated, the vacuum interrupter 220 is in the opened state. When the light of the second color is illuminated, the vacuum interrupter 220 is in the closed state. In another example, the perceivable indicator 236 may be a speaker or other device that produces one or more audible sounds. In yet another example, the perceivable indicator 236 is a transponder or other communications device that provides an electronic signal that is readable by a machine.

In the example of FIGS. 2A-2C, the user interface 230 includes the perceivable indicator 236. However, other implementations are possible and the perceivable indicator 236 is not necessarily part of the user interface 230. For example, the perceivable indicator 236 may be mounted on or in the housing 202. In some implementations, the housing 202 includes one or more windows or observation ports, and the perceivable indicator 236 is within the housing 202 and is visually observable through the window or port.

Moreover, the user interface 230 may include additional components. For example, the user interface 230 may include a low-voltage control or a low-voltage communications module that is capable of communicating with a remote station, such as, for example, a laptop, a smart phone, or a remote control. In these implementations, the low-voltage control may be used to change the state of the vacuum interrupter 220 instead of the manual operating mechanism 234, or the low-voltage control may be used to operate the manual operating mechanism 234 without the operator having to make physical contact with the manual operating mechanism 234.

Referring also to FIGS. 2B and 2C, the vacuum interrupter 220 is inside of the interrupter housing 261. The vacuum interrupter 220 may be embedded or encased in a solid dielectric insulation. The vacuum interrupter 220 includes a stationary conductor 222a and a movable conductor 222b. The stationary conductor 222a is electrically connected to the terminal 273 and to a stationary contact 223a. The movable conductor 222b is electrically connected to a movable contact 223b. The stationary conductor 222a, the stationary contact 223a, the movable conductor 222b, and the movable contact 223b are made of an electrically conductive material, for example, a metal such as copper, silver, chromium, or tungsten, or alloys made of one or more such metals.

The stationary contact 223a and the movable contact 223b are in an evacuated space that is enclosed by a vacuum bottle 224. The stationary conductor 222a extends in the Z direction through an opening (not labeled) in the vacuum bottle 224 to the terminal 273. The opening is sealed around the stationary conductor 222a to maintain the evacuated space in the vacuum bottle 224. The movable conductor 222b extends in the −Z direction through another opening (not labeled) in the vacuum bottle 224. The movable conductor 222b is surrounded by bellows 225 that allow the movable conductor 222b to move without breaking the seal of the vacuum bottle 224. The bellows 225 are protected by a shield 226. The terminal 272 is electrically connected to the movable conductor 222b.

The switching apparatus 210 also includes various components that are associated with the operation and monitoring of the vacuum interrupter 220. In the example of FIGS. 2B and 2C, the various components are the current transformer 242, the actuator 244, and the electronic control 246.

The current transformer 242 includes a ring core that surrounds the movable conductor 222b. When AC current flows in the movable conductor 222b, a time-varying magnetic field is generated around the movable conductor 222b. The time-varying magnetic field causes a current to flow in a wire that is wound around the core of the current transformer 242. This induced current is inversely proportional to the number of turns of the wire wound around the core of the current transformer 242. Thus, the amount of AC current flowing in the movable conductor 222b may be determined by measuring the induced current.

In the example above, the current transformer 242 is a single primary turn current transformer (CT). However, other implementations are possible. For example, the current transformer 242 may have multiple primary turns. Furthermore, the current in the movable conductor 222b may be sensed via other sensors in addition to or instead of the current transformer 242. The other sensors may include a device, such as, for example, a Rogowski coil, instead of or in addition to the current transformer 242.

The current transformer 242 is electrically connected to the electronic control 246 via a signal path 247. The signal path 247 is, for example, an electrical wire or cable. The current transformer 242 provides an indication of the amount of current flowing in the movable conductor 222b to the electronic control 246 via the signal path 247. The current transformer 242 also may provide electrical power to the electronic control 246. In implementations in which the current transformer 242 provides electrical power to the electronic control 246, the power may be provided to the control 246 via an electrical connection that is separate from the signal path 247.

Thus, the current transformer 242 may provide current measurements that the electronic control 246 uses to determine whether a fault or other operating error condition exists, and the current transformer 242 also may provide electrical power to the electronic control 246. The current transformer 242 harvests electrical energy from the movable conductor 222b when current flows in the movable conductor 222b. The apparatus 210 also may include a back-up power source (not shown) that powers the electronic control 246 when electricity does not flow in the movable conductor 222b. The back-up power source may be, for example, a battery or other rechargeable power source that is charged by the current transformer 242 when current flows in the movable conductor 222b.

FIG. 2B shows the vacuum interrupter 220 in a closed state. In the closed state, the movable contact 223b is in contact with the stationary contact 223a, and current flows between the terminal 273 and the terminal 272. FIG. 2C shows the vacuum interrupter 220 in an opened state. In the opened state, the movable contact 223b is separated from the stationary contact 223a, and current cannot not flow between the terminal 273 and the terminal 272.

The actuator 244 and/or the manual operating mechanism 234 are used to transition the vacuum interrupter 220 between the closed state (FIG. 2B) and the open state (FIG.

2C). FIGS. 2B and 2C show an example of using the manual operating mechanism 234 to transition the vacuum interrupter 220. In FIG. 2B, the manual operating mechanism 234 is in a first position. In FIG. 2C, the manual operating mechanism 234 is in a second position.

To move from the first position to the second position, the manual operating mechanism 234 is moved along an arc 238 in the clockwise direction (looking into the page). To move from the second position to the first position, the manual operating mechanism 234 is moved along the arc 238 in the counterclockwise direction. For example, to obtain the configuration shown in FIG. 2C, the manual operating mechanism 234 was moved along the arc 238 from the first position shown in FIG. 2B to the second position. The manual operating mechanism 234 may be moved by a human operator.

Moving the manual operating mechanism 234 along the arc 238 in the clockwise direction to the second position presses a base 251 of the insulating operating rod 250 in the −Z direction. The base 251 may be part of the insulating operating rod 250 or may be a separate part that is added or attached to the insulating operating rod 250. Thus, when the base 251 moves in the −Z direction, the insulating operating rod 250 also moves in the −Z direction. The insulating operating rod 250 is mechanically coupled to a spring assembly 254, which includes a spring 255 that is mechanically connected to the movable conductor 222b. When the insulating operating rod 250 moves in the −Z direction, the spring assembly 254 and the movable conductor 222b also move in the −Z direction. Thus, the movable contact 223b moves in the −Z direction and separates from the stationary contact 223a, as shown in FIG. 2C.

To reconnect the movable contact 223b and the stationary contact 223a, the movable conductor 222b is moved in the Z direction until the contacts 223a and 223b are joined. The operator may move the movable conductor 222b in the Z direction by moving the operating mechanism 234 along the arc 238 in the counterclockwise direction. Thus, the operating mechanism 234 is an open and close mechanism. Other implementations are possible. For example, the operating mechanism 234 may be an open-only mechanism. Moreover, and as discussed below, in some implementations, the actuator 244 is configured to transition the vacuum interrupter 220 between states without activation of the manual operation mechanism 234.

In the example shown in FIGS. 2A-2C, the spring assembly 254 is between the insulating operating rod 250 and the movable conductor 222b and the mechanical coupling between the insulating operating rod 250 and the movable conductor 222b is indirect. Other implementations are possible. For example, the movable conductor 222b may be directly attached to the insulating operating rod 250 without intervening components. Moreover, in implementations in which the mechanical coupling or connection between the insulating operating rod 250 and the movable conductor 222b is indirect, components other than and/or in addition to the spring assembly 254 may be used to mechanically couple the insulating operating rod 250 and the movable conductor 222b. For example, more than one spring assembly may be between the insulating operating rod 250 and the movable conductor 222b. In other examples, a damper, links, and/or other mechanical components, and the spring assembly 254 may be between the insulating operating rod 250 and the movable conductor 222b.

The insulating operating rod 250 provides electrical isolation between the user interface 230 and the elements (such as the vacuum interrupter 220) that are at system voltage during operational use of the switching apparatus 210. The presence of the insulating operating rod 250 allows an operator to safely use the manual operating mechanism 234 to open the vacuum interrupter 220 even when the terminal 272 is electrically connected to a high-voltage distribution path. The insulating operating rod 250 may be made of any type of electrically insulating material that is sufficiently strong and robust to move the movable conductor 222b. The insulating operating rod 250 may be made of, for example, cycloaliphatic or bisphenol epoxy, protruded or wound fiberglass, glass-filled bulk molding compound, and/or polymer concrete.

The insulating operating rod 250 is sufficiently strong and robust to move the movable conductor 222b via the actuator 244, and the insulating operating rod 250 is also able to withstand the voltage differential between the actuator 244 and the user interface 230. Because the insulating operating rod 250 is between the manual operating mechanism 234 and the actuator 244, the mechanical requirements of the insulating operating rod 250 are reduced as compared to a configuration in which the operating rod 250 is between the actuator 244 and the vacuum interrupter 220. For example, the stationary contact 223a and the movable contact 223b may become welded shut from conducting high currents. The actuator 244 provides a mechanical impact that is sufficient to break the weld and separate the contacts 223a and 223b. In a configuration in which the rod 250 is between the actuator 244 and the vacuum interrupter 220, the operating rod 250 also experiences this mechanical force. By placing the insulating operating rod 250 between the user interface 230 and the actuator 244 (such as in the configuration shown in FIGS. 2A-2C), the insulating operating rod 250 does not experience this mechanical force. Thus, the arrangement shown in FIGS. 2A-2C has greater flexibility and more options for the operating rod 250 because the rod 250 may experience lower mechanical forces.

The actuator 244 may be used to transition the vacuum interrupter 220 between the opened and closed states without the operator manually activating the manual operation mechanism 234. The actuator 244 is any type of actuator known in the art that is capable of being controlled by the electronic control 246. For example, the actuator 244 may be a bistable magnetic latching actuator. The electronic control 246 controls the actuator 244 through a signal path 249. The signal path 249 may be, for example, an electrical wire or cable. When the actuator 244 is activated by the electronic control 246 or the manual operating mechanism 234, the actuator 244 causes the movable conductor 222b to move in the −Z direction (to open the vacuum interrupter 220) or in the Z direction (to close the vacuum interrupter). In this way, the electronic control 246 is also able to control the state of the vacuum interrupter 220.

The perceivable indicator 236 provides an indication of the state of the vacuum interrupter 220, and that indicator is perceivable from an exterior of the switching apparatus 210. In the example of FIGS. 2A-2C, the perceivable indicator 236 provides a textual indication of the state of the vacuum interrupter 220. Specifically, in the example of FIGS. 2A-2C, if the vacuum interrupter 220 is in the opened state, the sign 237 is positioned such that the text "OPEN" is appears in the perceivable indicator 236. If the vacuum interrupter 220 is in the closed state, the sign 237 is positioned such that the text "CLOSED" is visible in the perceivable indicator 236. The sign 237 moves with the insulating operating rod 250.

The perceivable indicator 236 may be in communication with the electronic control 246. For example, the electronic control 246 may provide the perceivable indicator 236 with a binary vacuum interrupter status signal that indicates the state of the vacuum interrupter 220. The perceivable indicator 236 and the electronic control 246 may communicate via a high-impedance lead in the insulating operating rod 250 or by a wireless connection (for example, a Bluetooth or WiFi connection) between the perceivable indicator 236 and the electronic control 246.

Furthermore, in some implementations, a voltage harvesting technique is used to power the electronic control 246. For example, a high-impedance element (for example, a resistor and/or a capacitor with a relatively high impedance) may be embedded in the operating rod 250 or the insulating body 266. In these implementations, the electronic control 246 includes a lower impedance element. This configuration produces a stepped-down voltage that may be used as a source of power to keep the electronic control 246 powered and activated when no power is flowing through the current transformer 242. A lower impedance may be in user interface 230 to power any grounded or low voltage electronics in the user interface 230, such as powering lights, sound mechanism, or other mechanisms for the indicator 236.

Also, in implementations that include a voltage harvesting technique, the switching apparatus 210 may include one or more sensors that are configured to monitor the voltage harvesting. For example, the switching apparatus 210 may include a voltage and/or current sensor (in addition to the CT 242) that measures the voltage and/or current flowing in the high-impedance element that is embedded in the operating rod 250 or the body 266. These voltage and/or current sensors may provide measured data to the electronic control 246, and the measured data may be used to determine power metrics and other information about the harvesting.

Referring also to FIG. 2D, the electronic control 246 includes an electronic processing module 281, an electronic storage 282, and an input/output (I/O) interface 283. The I/O interface 283 allows the electronic control 246 to communicate with components in the switching apparatus 210 or with external devices. In some implementations, the electronic processing module 281, the electronic storage 282, and the I/O interface 283 are implemented as a microcontroller. The electronic processing module 281 includes one or more electronic processors. The electronic processors of the module 281 may be any type of electronic processor, may be multiple types of processors, and may or may not include a general purpose central processing unit (CPU), a graphics processing unit (GPU), a microcontroller, a field-programmable gate array (FPGA), Complex Programmable Logic Device (CPLD), a digital signal processor (DSP), a microcontroller unit (MCU) and/or an application-specific integrated circuit (ASIC).

The electronic storage 282 is any type of electronic memory that is capable of storing data and instructions in the form of computer programs or software, and may include multiple types of memory. For example, the electronic storage 282 may include volatile and/or non-volatile components. The electronic storage 282 and the processing module 281 are coupled such that the processing module 281 is able to read data from and write data to the electronic storage 282.

The electronic storage 282 stores data and information related to the operation of the vacuum interrupter 220. For example, the electronic storage 282 may store a fault current limit. The electronic storage 282 also stores executable instructions in the form of a computer program or functions that cause the processing module 281 to perform actions related to the operation of the vacuum interrupter 220. For example, the electronic storage 282 may store instructions that compare an indication of the current flowing in the movable conductor 222b (which is provided by the current transformer 242) to the fault current limit. The electronic storage also may store instructions in the form of a computer program that causes the electronic processing module 281 to issue a command to the actuator 244 that causes the movable contact 223b and the movable conductor 222b to move in the −Z direction to open the vacuum interrupter 220 in the presence of a fault.

The I/O interface 283 is any interface that allows a human operator, an external device, and/or an autonomous process to interact with the electronic control 246. The I/O interface 283 also allows the electronic control 246 to communicate with other components in the switching apparatus 210, such as the current transformer 242 and the actuator 244. In some implementations, the I/O interface 283 is configured to provide a vacuum interrupter status signal to the perceivable indicator 236. The I/O interface 283 may include, for example, audio input and/or output (such as speakers and/or a microphone), visual output (such as lights, light emitting diodes (LED)), serial or parallel port, a Universal Serial Bus (USB) connection, and/or any type of network interface, such as, for example, Ethernet. The I/O interface 283 also may allow communication without physical contact through, for example, an IEEE 802.11, Bluetooth, cellular, or a near-field communication (NFC) connection. The electronic control 246 may be, for example, operated, configured, modified, or updated through the I/O interface 283.

In some implementations, the I/O interface 283 enables the electronic control 246 to communicate with a remote station (not shown). The remote station is be any type of station through which an operator is able to communicate with the electronic control 246 without making physical contact with the electronic control 246. For example, the remote station may be a computer-based work station, a smart phone, tablet, or a laptop computer that connects to the electronic control 246 via a services protocol, or a remote control that connects to the electronic control 246 via a radio-frequency signal.

Figure 3:
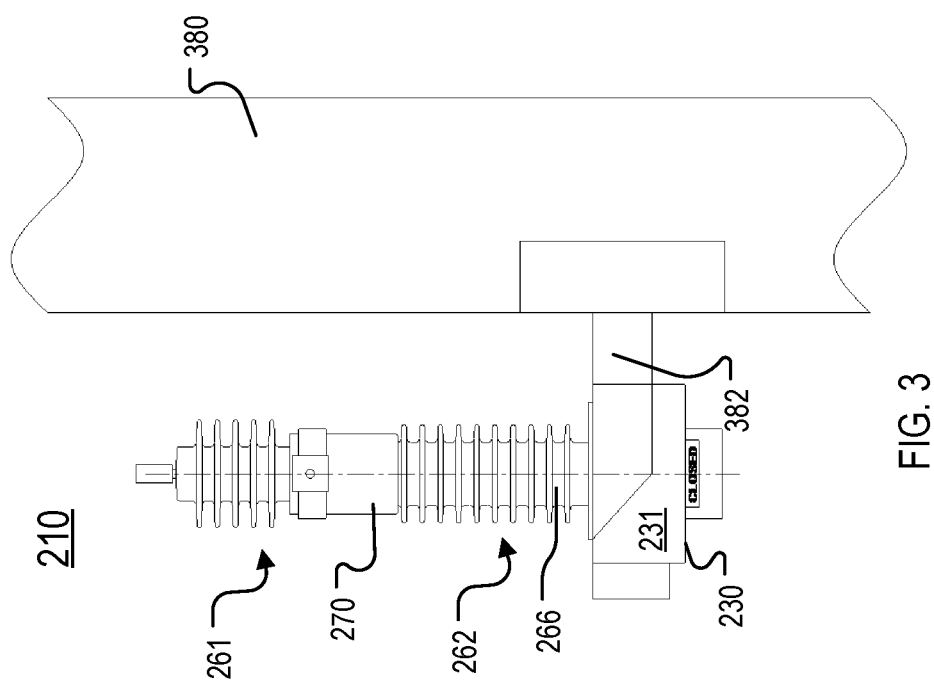
FIG. 3 is another example of a switching apparatus.

FIG. 3 is a side block diagram of the switching apparatus 210 mounted to a utility structure 380. The utility structure 380 may be, for example, a utility pole. The switching apparatus 210 is mounted to the utility structure 380 by a bracket 382. The bracket 382 connects to the tank 231 and to the utility structure 380. The bracket 382 is made of any durable material, such as, for example, a metal or a rugged polymer. As discussed above, the tank 231 is isolated from the high-voltage portions of the switching apparatus 210. Thus, the bracket 382 can be directly attached to the utility structure 380.

Figure 4:
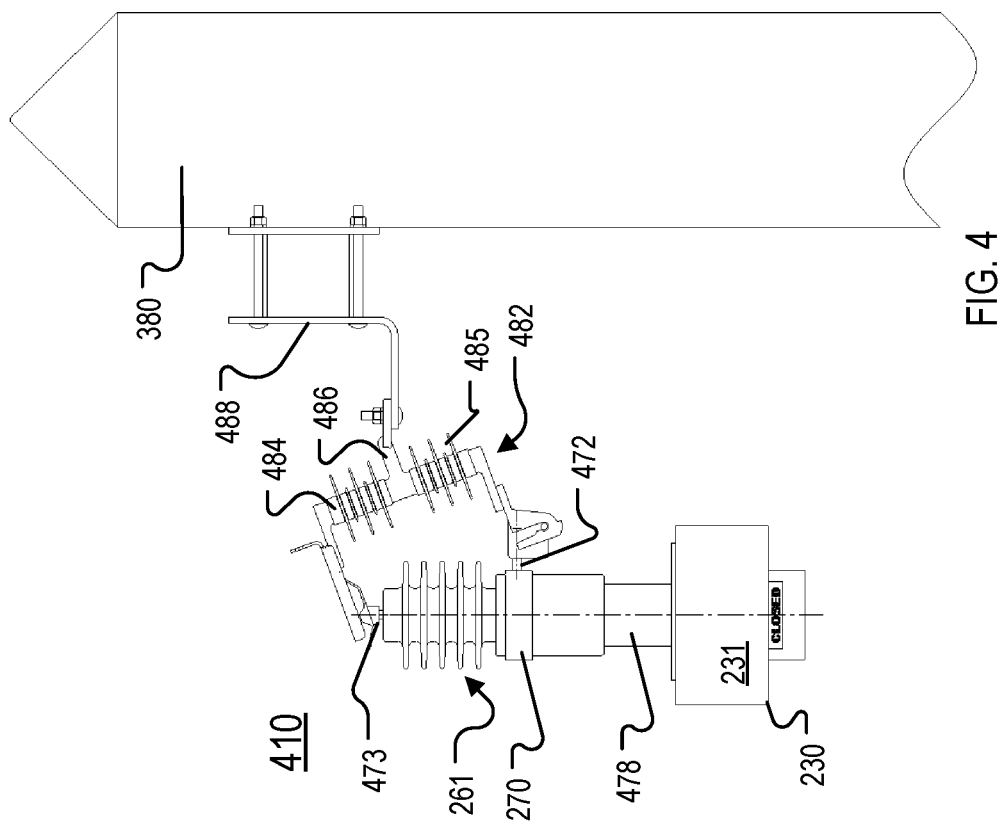
FIG. 4 is another example of a switching apparatus.

FIG. 4 provides an example of the modularity of the switching apparatus 210. For example, the operating housing 262 and the insulating operating rod 250 may be removed from the interrupter housing 261. FIG. 4 is a side block diagram of a switching apparatus 410 mounted to the utility structure 380. The switching apparatus 410 is the same as the switching apparatus 210, except the switching apparatus 410 does not include the insulating operating rod 250 or the operating housing 262. Instead, the switching apparatus 410 includes the interrupter housing 261, the terminal ring 270, the tank 231, and a connection housing 478 between the terminal ring 270 and the tank 231. The switching apparatus 410 includes the vacuum interrupter 220 and the various associated components; however, the switching apparatus 410 does not include the insulating operating rod 250. Thus, the tank 231 is not isolated from the high-voltage portion of the switching apparatus 410, and the tank 231 is also at a relatively high voltage during use.

Because the tank 231 is not grounded, the switching apparatus 410 is mounted to the utility structure 380 with a cut-out 482 and a mounting bracket 488. The cut-out 482 also attaches to the switching apparatus 410 at a terminal 472 and a terminal 473. The terminals 472 and 473 mount in the cut-out 482 rather than directly mounting to the distribution path 106 and the load 103. The cut-out 482 includes an insulating housing 484 with sheds 485. The insulating housing 484 is made of an electrically insulating material such as, for example, a polymer or a ceramic. The insulating housing 484 includes an insulated connection point 486. The insulated connection point 486 is attached to the mounting bracket 488, which is attached to the utility structure 380.

Accordingly, the switching apparatus 210 offers a flexible design that may be modified to fit the end-user's requirements. As shown in FIG. 3, the switching apparatus 210 may be configured with the operating housing 262 and the insulating operating rod 250 such that the tank 231 is grounded. Moreover, the switching apparatus 210 may be modular such that the operating housing 262 is removable. In these implementations, the tank 231 is not electrically isolated from the high-voltage portions and the tank 231 is not grounded. The switching apparatus 410 of FIG. 4 shows an example of such a configuration.

Furthermore, due to the modularity, different components may be added or removed to suit the application. For example, depending on the voltage and/or current rating for a particular application, a larger or smaller interrupter housing 261 may be used or a larger or smaller interrupter 220. Likewise, a larger or smaller operating housing 262 may be used depending on the voltage class. For example, for implementations that do not have a grounded user interface 230 (for example, as shown in FIG. 4), the connection housing 478 may be a lower-rated version of operating housing 262 that accommodates the actuator 244 with a significantly reduced (for example, smaller) operating rod 250 and/or insulating body 266. In these implementations, the insulating body 266 may lack the sheds 207.

FIGS. 5A-5C relate to another switching apparatus 510. The switching apparatus 510 is another example of an implementation of the switching apparatus 110 (FIG. 1). FIG. 5A is a side exterior view of the switching apparatus 510. FIGS. 5B and 5C are cross-sectional side views of the switching apparatus 510. FIG. 5B shows the switching apparatus 510 in a closed state. FIG. 5C shows the switching apparatus 510 in an open state. Although the switching apparatus 510 has a different configuration than the switching apparatus 210, the switching apparatus 510 uses some of the elements of the switching apparatus 210. Like the switching apparatus 210, the switching apparatus 510 includes the user interface 230. The user interface 230 is electrically isolated from the high-voltage portions of the switching apparatus 510.

The switching apparatus 510 includes the vacuum interrupter 220, the current transformer 242, an actuator 544, and the electronic control 246. The vacuum interrupter 220, the current transformer 242, the actuator 544, and the electronic control 246 are electrically connected to each other and there is no substantial insulation between these elements. These elements are electrically isolated from the user interface 230 by the insulating operating rod 250. When the switching apparatus 510 is used in an electrical distribution system such as the system 100, the vacuum interrupter 220, the current transformer 242, the actuator 544, and the electronic control 246 are at the system voltage, and the user interface 230 is not at the system voltage. For example, the user interface 230 may be grounded or held at a low voltage.

The switching apparatus 510 includes an exterior housing 502 (FIG. 5A). The exterior housing 502 is generally T-shaped and has a longitudinal axis 575 that extends along the Z axis. The exterior housing 502 includes the interrupter housing 261, which encloses the vacuum interrupter 220, and an operating housing 562, which encloses the insulating operating rod 250. The exterior housing 502 also includes a side housing 591 and a central housing 592. In the example shown, side housing 591 is the same size and shape as the interrupter housing 261. However, other implementations are possible, and the side housing 591 is not necessarily the same size and shape as the interrupter housing 261.

The interrupter housing 261 and the side housing 591 extend from opposite ends of the central housing 592. In the example of FIGS. 5A-5C, the interrupter housing 261 extends from the central housing 592 in the −Y direction, and the side housing 591 extends from the central housing 592 in the Y direction. The operating housing 562 extends in the −Z direction from the center of the central housing 592. The user interface 230 is attached to the operating housing 562. A terminal 573 extends in the −Y direction from the interrupter housing 261. A terminal 572 extends in the Y direction from the side housing 591.

Referring also to FIGS. 5B and 5C, in the switching apparatus 510, the vacuum interrupter 220 is oriented horizontally (along the Y axis). This is different from the vertical (Z axis) orientation of the vacuum interrupter 220 in the switching apparatus 210 (FIGS. 2A-2C). The movable conductor 222b of the vacuum interrupter 220 is coupled to a spring assembly 554a, and the spring assembly 554a is coupled to a first link 532a at a pivot point 536. The first link 532a is able to move about the pivot point 536. The first link 532a is coupled to a second link 532b and to a third link 532c at a pivot point 533. The second link 532b is coupled to a spring assembly 554b at a pivot point 537. The spring assembly 554b is mounted on a stationary conductor 522c that is electrically connected to the terminal 572. The first link 532a, the second link 532b, and the third link 532c are made of a robust and durable material such as, for example, steel, stainless steel, or aluminum. The first link 532a, the second link 532b, and the third link 532c are connected to each other at the pivot point 533 by, for example, a rivet or a pin that allows the links 532a, 532b, and 532c to move about the pivot point 533. The links 532a, 532b, and 532c are also referred to as over toggle linkages 532a, 532b, and 532c.

The third link 532c is coupled to the actuator 544, which is coupled to the insulating operating rod 250. The actuator 544 is a bi-directional solenoid that lacks a latching mechanism. The latching aspect of the actuator 544 is achieved via the first and second over toggle linkages 532a and 532b along with the spring assemblies 554a and 554b and an opening spring 555. The spring assembly 554a is a contact pressure spring that applies force between contact make (when the movable contact 223b moves into contact with the stationary contact 223a) and the latched position. The spring assembly 554a does not apply force when the vacuum interrupter 220 is open.

The switching apparatus 510 also includes a first current exchange base portion 556a, a second current exchange base portion 556b, and a current exchange lead 557. The first current exchange base portion 556a is electrically connected to the movable conductor 222b. The opening spring 555 is between the first current exchange base portion 556a and the vacuum interrupter 220. The second current exchange base portion 556b is electrically connected to the stationary conductor 522c. The second current exchange base portion 556b is between the current transformer 242 and the spring assembly 554b. The current exchange lead 557 is electrically connected to the first current exchange base portion 556a and the second current exchange base portion 556b. The first current exchange base portion 556a, the second current exchange base portion 556b, and the current exchange lead 557 are made of an electrically conductive material such as, for example, copper, silver, brass, bronze, aluminum, and/or another metal or alloys made of such metals. The current exchange base portions 556a and 556b and the current exchange lead 557 may be plated with silver or tin to help prevent corrosion.

The current transformer 242 is positioned to measure current flow in the stationary conductor 522c. The current transformer 242 is electrically coupled to the electronic control 246 via a signal path 547. The electronic control 246 is electrically coupled to the actuator 544 via a signal path 549. The signal paths 547 and 549 are, for example, electrical wires or cables that are capable of carrying data and command signals.

When the vacuum interrupter 220 is in the closed state (FIG. 5B), electrical current flows between the terminal 573 and the terminal 572 via the stationary conductor 222a, the contacts 223a and 223b, the movable conductor 222b, the first current exchange base 556a, the current exchange lead 557, the second current exchange base 556b, and the stationary conductor 522c. The vacuum interrupter 220, the current transformer 242, the actuator 544, the first current exchange base 556a, the current exchange lead 557, the second current exchange base 556b, and the electronic control 246 are at the system voltage. The links 532a, 532b, 532c also may be at the system voltage. The insulating operating rod 250 isolates the user interface 230 from the elements at the system voltage.

FIGS. 5B and 5C provide an example of transitioning the vacuum interrupter 220 from the closed state (FIG. 5B) to the opened state (FIG. 5C) using the manual operating mechanism 234. A human operator moves the manual operating mechanism 234 along the arc 238 to the position shown in FIG. 2C. Moving the operating mechanism 234 causes the insulating operating rod 250 and the third link 532c to move in the −Z direction. The first link 532a rotates about the pivot point 536 and the end of the first link 532a that is connected to the pivot point 533 moves in the −Z direction. Similarly, the second link 532b rotates about the pivot point 537 and the end of the second link 532b that is connected to the pivot point 533 moves in the −Z direction with the link 532c. The motion of the links 532a and 532b causes the spring assemblies 554a and 554b and the opening spring 555 to expand, and the movable contact 223b of the vacuum interrupter 220 separates from the stationary contact 223a. The vacuum interrupter 220 is then in the opened state, and current does not flow between the terminal 572 and the terminal 573. To transition the vacuum interrupter 220 to the closed state, the manual operating mechanism 234 is returned to the position shown in FIG. 5B.

These and other implementations are within the scope of the claims.

For example, the various components of any of the switching apparatuses 110, 210, 410, and 510 may be arranged in a manner other than shown above. For instance, in some implementations, the operating rod 250 extends in a direction other than shown above. The operating rod 250 may extend horizontally (in other words, perpendicular to the orientation of the operating rod 250 shown in FIGS. 2B, 2C, 5B, and 5C).

In another example, the switching apparatus 510 may be configured with the central housing 592, the side housing 591, and the interrupting housing 261 arranged along the Y axis and the operating housing 562 arranged along the X axis. In these implementations, the tank 231 is mounted to a structure (for example, a utility pole) that extends along the Z axis.

What is claimed is:
1. An apparatus comprising:
a high-voltage module comprising:
    a current interrupter;
    an actuation system coupled to the current interrupter;
    a sensor system; and
    a terminal assembly comprising a terminal configured to electrically connect to an external electrical device;
a user interface; and
an electrically insulating assembly between the user interface and the high-voltage module, the electrically insulating assembly comprising: an operating housing and an electrically insulating operating rod in the operating housing,
wherein the electrically insulating operating rod extends between the user interface and the actuation system of the high-voltage module; the operating housing extends between the user interface and the terminal assembly; and wherein, in operational use, the user interface is grounded and the high-voltage module is at a system voltage.

2. The apparatus of claim 1, wherein the user interface does not surround the high-voltage module.

3. The apparatus of claim 1, wherein the electrically insulating assembly, the user interface, and at least a portion of the high-voltage module are arranged along a longitudinal axis of the apparatus; and the electrically insulating assembly extends along the longitudinal axis.

4. The apparatus of claim 1, wherein the user interface comprises:
a tank; and
a manual operating mechanism on an exterior of the tank.

5. The apparatus of claim 4, wherein the user interface further comprises: an indicator on the exterior of the tank, wherein the indicator produces a perceivable indication related to a status of the current interrupter.

6. The apparatus of claim 1, wherein the user interface comprises a visible indicator configured to produce an indication related to a status of the current interrupter, and the indication is visually perceivable from an exterior of the apparatus.

7. The apparatus of claim 1, wherein the circuit interrupter comprises a vacuum interrupter.

8. The apparatus of claim 7, wherein the vacuum interrupter comprises: a stationary electrical conductor electrically connected to a stationary conductor, and a moving electrical conductor electrically connected to a moving conductor; and
    the electrically insulating operating rod is mechanically coupled to the moving electrical conductor.

9. The apparatus of claim 8, wherein the electrically insulating operating rod is mechanically coupled to the moving electrical conductor by a spring.

10. The apparatus of claim 1, wherein the sensor system comprises a current transformer.

11. The apparatus of claim 1, wherein the sensor system comprises a Rogowski coil.

12. The apparatus of claim 1, wherein the high-voltage module further comprises an electronic control.

13. The apparatus of claim 12, wherein the sensor system comprises an energy harvesting device, and the electronic control is powered by the sensor system.

14. The apparatus of claim 12, wherein the sensor system configured to measure an electrical quantity of the current interrupter, and to provide an indication of the measured electrical quantity to the electronic control; and
the electronic control is configured to determine whether a fault condition exists based on the indication.

15. The apparatus of claim 1, wherein the system voltage is 15 kilovolts (kV) or higher.

16. The apparatus of claim 1, wherein the electrically insulating assembly comprises a plurality of electrically insulating operating rods.

17. The apparatus of claim 1, further comprising an indication system configured to provide an indication of a status of the current interrupter.

18. The apparatus of claim 1, wherein the operating housing is configured to be connected to and disconnected from the terminal assembly such that the assembly is modular.

19. The apparatus of claim 1, wherein the high-voltage module further comprises an interrupter housing; and the current interrupter, the actuation system, and the sensor system are in the interrupter housing; and wherein, in operational use, the high-voltage module and the interrupter housing are ungrounded.

20. A modular switching apparatus comprising:
a current interrupter;
an interrupter housing that surrounds the current interrupter;
an electrically insulating operating rod configured to control a state of the current interrupter;
an operating housing that surrounds the electrically insulating operating rod; and
a user interface, wherein the interrupter housing and the operating housing are removably connected to each other and the user interface is configured for connection to the interrupter housing or the operating housing.

21. The modular switching apparatus of claim 20 further comprising a terminal assembly at an end of the interrupter housing, and wherein, the operating housing is configured to be connected to the terminal assembly to thereby connect the interrupter housing and the operating housing.

22. The modular switching apparatus of claim 21, wherein, when the operating housing is connected to the terminal assembly, the terminal assembly is between the operating housing and the interrupter housing, and the operating housing and the interrupter housing extend away from the terminal assembly in opposite directions.

* * * * *